US006819192B2

(12) United States Patent
Gauthier et al.

(10) Patent No.: US 6,819,192 B2
(45) Date of Patent: Nov. 16, 2004

(54) JITTER ESTIMATION FOR A PHASE LOCKED LOOP

(75) Inventors: Claude Gauthier, Fremont, CA (US); Brian Amick, Austin, TX (US); Dean Liu, Sunnyvale, CA (US); Pradeep Trivedi, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/075,750

(22) Filed: Feb. 14, 2002

(65) Prior Publication Data

US 2003/0151464 A1 Aug. 14, 2003

(51) Int. Cl.[7] .............................................. H03B 1/00
(52) U.S. Cl. ...................................... 331/74; 375/371
(58) Field of Search ............................. 331/14, 11, 17, 331/74, 78, 25; 327/143, 147, 156, 162, 551, 20; 375/371, 373

(56) References Cited

U.S. PATENT DOCUMENTS 5,828,255 A * 10/1998 Kelkar et al. ............... 327/157

6,333,905 B2 * 12/2001 Kobayashi et al. ........ 369/59.11
6,441,602 B1 * 8/2002 Eckhardt et al. .......... 324/76.53
6,460,001 B1 * 10/2002 Yamaguchi et al. .......... 702/69

OTHER PUBLICATIONS

Measuring Jitter and Phase Error in Microprocessor Phase–Locked Loops, Keith A. Jenkins and James P. Eckhardt, IEEE Design & Test of Computers, Apr.–Jun. 2000, pp. 86–93.*

* cited by examiner

Primary Examiner—Timothy P. Callahan
Assistant Examiner—Cassandra Cox
(74) Attorney, Agent, or Firm—Osha & May L.L.P.

(57) ABSTRACT

A method for estimating jitter in a phase locked loop is provided. The estimation is determined from a simulation that uses a representative power supply waveform having noise as an input. Further, a computer system for estimating jitter in a phase locked loop is provided. Further, a computer-readable medium having recorded thereon instructions adapted to estimate jitter in a phase locked loop is provided.

33 Claims, 7 Drawing Sheets

JITTER ESTIMATION FOR A PHASE LOCKED LOOP

BACKGROUND OF INVENTION

As shown in FIG. 1, a typical computer system (10) has, among other components, a microprocessor (12), one or more forms of memory (14), integrated circuits (16) having specific functionalities, and peripheral computer resources (not shown), e.g., monitor, keyboard, software programs, etc. These components communicate with one another via communication paths (19), e.g., wires, buses, etc., to accomplish the various tasks of the computer system (10).

In order to properly accomplish such tasks, the computer system (10) relies on the basis of time to coordinate its various operations. To that end, a crystal oscillator (18) generates a system clock signal (referred to and known in the art as "reference clock" and shown in FIG. 1 as sys_clk) to various parts of the computer system (10). Modern microprocessors and other integrated circuits, however, are typically capable of operating at frequencies significantly higher than the system clock, and thus, it becomes important to ensure that operations involving the microprocessor (12) and the other components of the computer system (10) use a proper and accurate reference of time.

One component used within the computer system (10) to ensure a proper reference of time among a system clock and a microprocessor clock, i.e., "chip clock," is a type of clock generator known as a phase locked loop, or "PLL" (20). The PLL (20) is an electronic circuit that controls an oscillator such that the oscillator maintains a constant phase relative to a system signal. Referring to FIG. 1, the PLL (20) has as its input the system clock, which is its reference signal, and outputs a chip clock signal (shown in FIG. 1 as chip_clk) to the microprocessor (12). The system clock and chip clock have a specific phase and frequency relationship controlled by the PLL (20). This relationship between the phases and frequencies of the system clock and chip clock ensures that the various components within the microprocessor (12) use a controlled and accounted for reference of time. When this relationship is not maintained by the PLL (20), however, the operations within the computer system (10) become non-deterministic.

FIG. 2 shows a PLL (20). The PLL (20) comprises a feedback loop that aligns the transition edge and frequency of the system clock (41) and a feedback loop signal (40). The PLL adjusts the output frequency in order to zero any phase and frequency difference between the system clock (41) and the feedback loop signal (40). The addition of a divide by N circuit (39) in the feedback loop enables the PLL to multiple the system clock (41). Multiplying the system clock is useful when the chip clock (42) must have a higher frequency than the system clock (41). The PLL core (36) adjusts the output frequency in order to zero any phase and frequency difference between the system clock (41) and the feedback loop signal (40). By adding the divide by N block (39), the chip clock (42) must be N times faster to allow the phase and frequency difference between the system clock (41) and the feedback loop signal (40) to zero. The PLL (20) may also have buffers (37, 38) to drive a larger resistive and/or capacitive load. The buffers (37, 38) are in the feedback loop so that the delay created by the buffers (37, 38) is zeroed by the PLL core (36).

One common performance measure for a PLL is jitter. Jitter is the time domain error from poor spectral purity of an output. In other words, in a repeated output pattern, such as a clock signal, a transition that occurs from one state to another does not happen at the same time relative to other transitions. Jitter is related to power supply noise. For a circuit designer to appropriately design a PLL, a good understanding of the behavior of the system is required.

FIG. 3 shows a section of a typical power supply network (100) of a computer system. The power supply network (100) may be representative of a single integrated circuit, or "chip", or equally an entire computer system comprising multiple integrated circuits. The power supply network (100) has a power supply (112) that provides a power supply line (114) and a ground line (116) through an impedance network $Z_1$ (118). The impedance network is a collection of passive elements that result from inherent resistance, capacitance, and/or inductance of physical connections. A power supply line (122, 123) and a ground line (124, 125) supply a circuit A (120) and circuit B (126), respectively. Power supply line (123) and ground line (125) also supply circuit C (130) through another impedance network $Z_2$ (128) and additional impedance networks and circuits, such as impedance network $Z_n$ (132) and circuit N (134). The impedance network and connected circuits may be simulated so that the designer can better understand the behavior of how the circuits interact.

Still referring to FIG. 3, circuit A (120), circuit B (126), circuit C (130), and circuit N (134) may be analog or digital circuits. Also, circuit A (120), circuit B (126), circuit C (130), and circuit N (134) may generate and/or be susceptible to power supply noise. For example, circuit C (130) may generate a large amount of power supply noise that affects the operation of both circuit B (126) and circuit N (134). The designer, in optimizing the performance of circuit B (126) and circuit N (134), requires an understanding of the characteristics of the power supply noise. By understanding the characteristics of the power supply noise, the designer has a foundation on which to use a variety of design techniques to minimize the amount of power supply noise.

SUMMARY OF INVENTION

According to one aspect of the present invention, a method for estimating jitter in a phase locked loop comprises inputting a representative power supply waveform having noise into a simulation of the phase locked loop, and estimating jitter of the phase locked loop from the simulation.

According to another aspect of the present invention, a computer system for estimating jitter in a phase locked loop comprises a processor, a memory; and software instructions stored in the memory adapted to cause the computer system to input a representative power supply waveform having noise into a simulation of the phase locked loop, and estimate jitter of the phase locked loop from the simulation.

According to another aspect of the present invention, a computer-readable medium having recorded thereon instructions executable by a processor, the instructions adapted to input a representative power supply waveform having noise into a simulation of a phase locked loop, and estimate jitter of the phase locked loop from the simulation.

Other aspects and advantages of the invention will be apparent from the following description and the appended claims.

DETAILED DESCRIPTION

Embodiments of the present invention relate to a method for estimating jitter in a phase locked loop. Embodiments of the present invention further relate to a computer system for estimating jitter in a phase locked loop. Embodiments of the present invention also relate to a program executed on a computer for estimating jitter in a phase locked loop.

Figure 1:
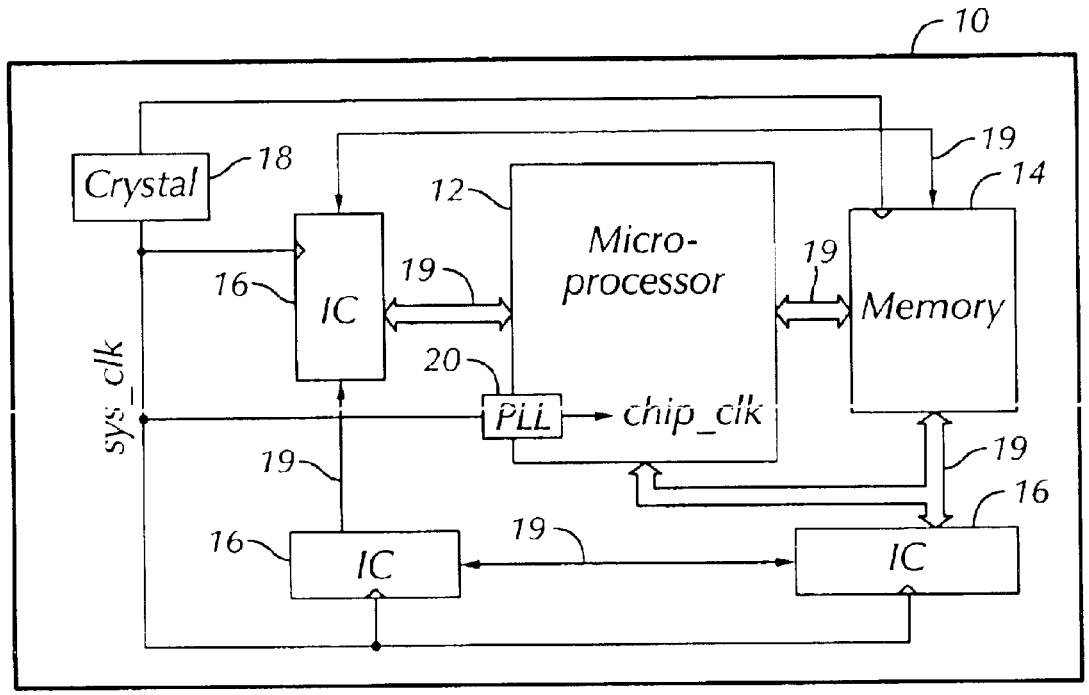
FIG. 1 shows a typical computer system.
Figure 2:
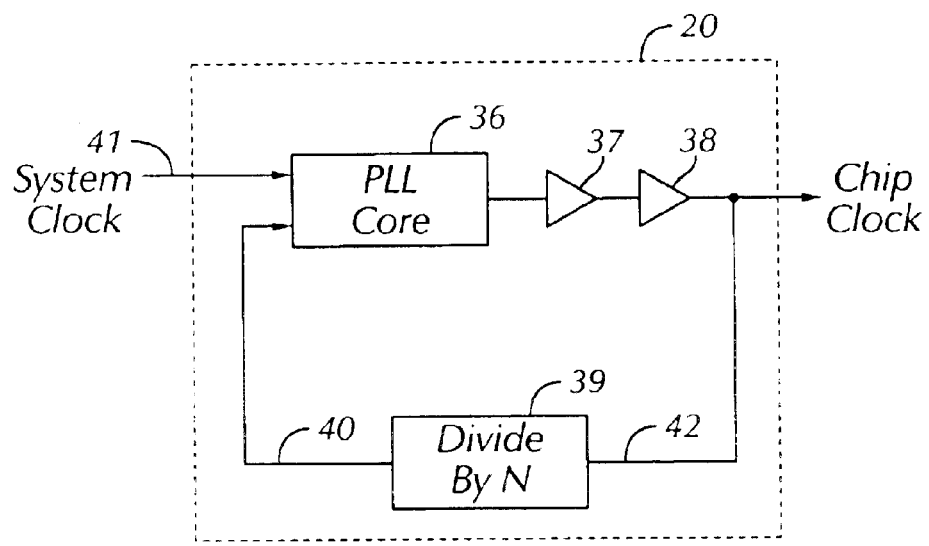
FIG. 2 shows a phase locked loop block diagram.
Figure 3:
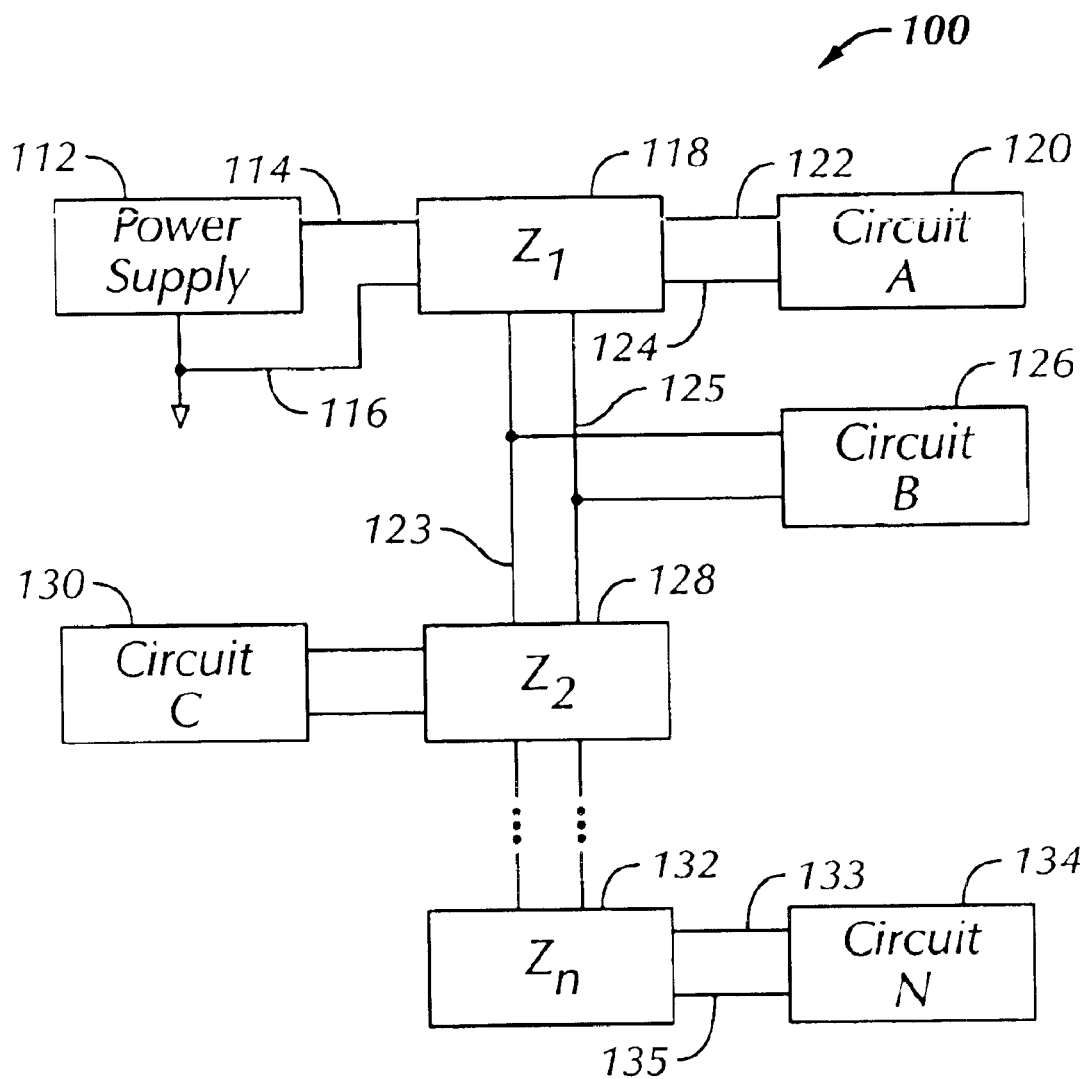
FIG. 3 shows a typical computer system power supply network.

In FIG. 3, the impedance networks (118, 128, 132) may be very complex arrangements of passive elements. The impedances may be the result of, but not limited to, a power supply connection, bulk capacitors, printed circuit board planes, printed circuit board vias, ceramic capacitors, printed circuit board to chip package connections, chip package planes, chip package vias, chip package capacitors, chip package to chip bump or bond wire connections, chip local and global decoupling capacitors, and switching and non-switching circuit elements. A "chip package" for the purpose of this description of the invention may be any package that allows mounting an integrated circuit to a printed circuit board. An integrated circuit, or die, is also referred to as a "chip" in this description. Also, each of the circuits (120, 126, 130, 134) in FIG. 3 may induce power supply noise on the impedance networks (118, 128, 132). The power supply noise characteristics can result from interactions between the circuits (120, 126, 130, 134) coupled with the impedance networks (118, 128, 132).

For a designer to adequately determine the effects of the power supply noise, a simulation model is desirable. The simulation model is input into a simulation tool so that a computer can calculate the effects of one or more input excitations. One example of a simulation tool is SPICE, which is an acronym for Simulation Program with Integrated Circuit Emphasis. Modeling a complex array of impedances is difficult, however. Furthermore, even if an accurate simulation model is created, the computing overhead necessary to simulate one or more circuits with the impedance model network may be too great.

Figure 4:
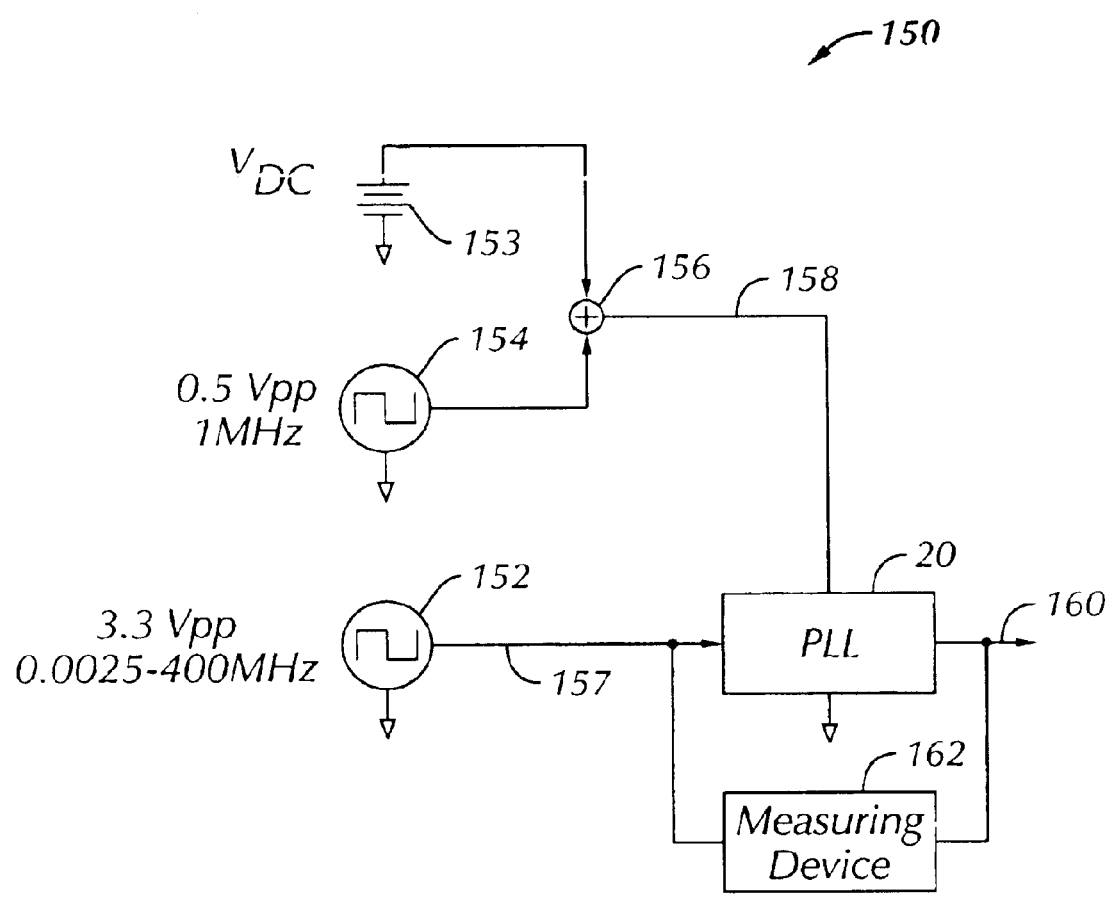
FIG. 4 shows a phase locked loop circuit test arrangement.

In the absence of an accurate model, worst case simulations are often used. In FIG. 4, a test arrangement (150) for a PLL (20) is shown. The PLL (20) is supplied by a DC power supply (153). The PLL (20) has, in this example, a clock input (152) comprising a square wave between 0 V and 3.3 V at a frequency that can be varied between 2.5 kHz and 400 MHz on signal line (157). The PLL output (160) has a frequency that is the same or a multiple of the clock input (152). A measuring device (162) measures the variations between the clock input (152) and the PLL output (160). Ideally, the PLL output (160) should be a multiple of N times the clock input (152); however, due to power supply noise, variations, or jitter, in the transition time from one state to another of the PLL output (160) occur. To model the power supply noise, a square wave generator (154) supplies a 0.5 V peak-to-peak signal that is added to the DC power supply (153) at adder (156). The combined DC power supply (153) and square wave generator (154) output is supplied on power supply line (158) to the PLL (20). The frequencies and voltages of the DC power supply (153), square wave generator (154), and clock input (152) may be changed to model different operating points.

In FIG. 4, because the noise generated by the square wave generator (154) may exceed typical power supply noise, adding additional circuitry to the PLL (20) may not be needed in the actual design to meet the desired specifications.

Figure 5A:
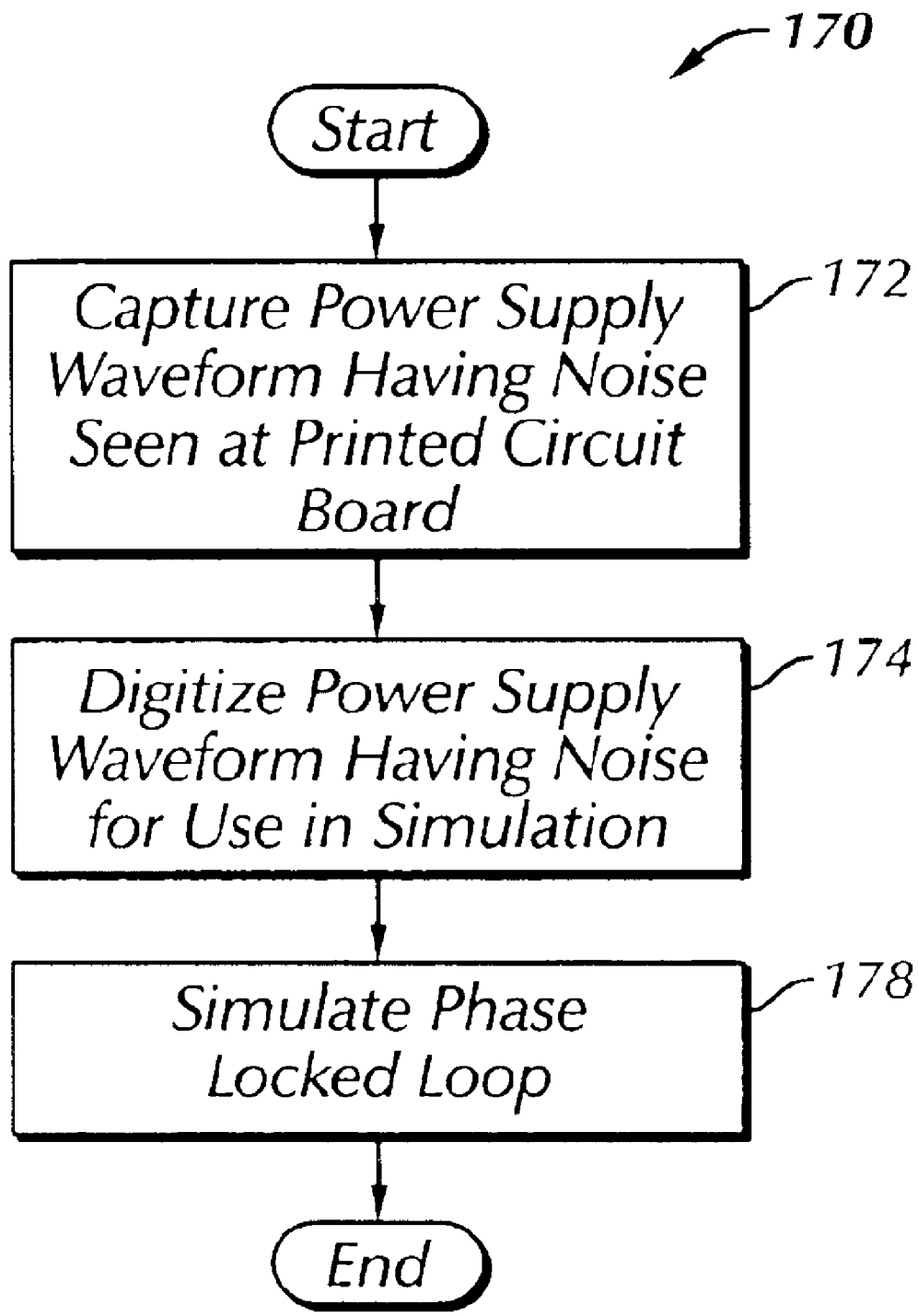
FIG. 5a shows a flow process in accordance with an embodiment of the present invention.

FIG. 5a shows an exemplary flow process (170) in accordance with an embodiment of the present invention. At (172), a power supply waveform having noise is captured. A power supply waveform having noise for the purpose of this description may be any power supply that has deviations from a designed voltage. This power supply waveform is captured at some particular location within a power supply network. Those skilled in the art will appreciate that the noise in the captured power supply waveform comes from a dominant source of noise. A circuit under design does not provide a substantial contribution to the noise in the captured power supply waveform. The power supply waveform having noise may be used to adequately represent a large portion of the power supply network and associated circuitry.

In FIG. 3, for example, circuit C (130) may be the dominant source of noise. The PLL under design may be circuit N (134). By capturing a power supply waveform having noise between impedance networks $Z_2$ (128) and $Z_n$ (132), a system response that represents a large portion of the power supply network and associated circuitry is used. For example, the power supply network and associated circuitry may include the power supply (112), impedance network $Z_1$ (118), circuit A (120), circuit B (126), circuit C (130), and impedance network $Z_2$ (128). Because the dominant source (circuit C (130)) is included in the power supply network and associated circuitry, a simulation using the power supply waveform having noise, impedance network $Z_n$ (132) and circuit N (134) is sufficient.

With regard to simulating a CPU circuit, capturing a power supply waveform on a printed circuit board near the CPU is desirable. The captured power supply waveform will also contain noise as a result of activities on the printed circuit board by one or more circuits. The captured power supply waveform may be the result of physically measuring the voltage on the printed circuit board under operating conditions with measuring equipment. These operating conditions may include extreme conditions in an effort to capture a worst case power supply waveform having noise. These operating conditions may be the result of varying one or more of the following: temperature, voltage, frequency, and manufacturing process. The captured power supply waveform may also be the result of a simulation of some portion of the power supply network. For the purposes of this description of the invention, a representative power supply waveform comprises an approximation of an actual power supply waveform as occurs in a realistic system. By capturing the power supply waveform at an intermediate point in the power supply network, a division in design responsibilities and expertise is achieved. A power supply network designer may focus on design and simulation of a portion of the power supply network while a circuit designer may capture representative power supply signals at an appropriate location to be used as an input to designed circuits.

The captured power supply waveform is digitized at (174) to be input to a simulation program. The digitization may be a direct point by point representation. The digitization may also be a representative model of the waveform that may include a formulated representation in which an equation characterizes the power supply waveform having noise. At (178), the PLL under design is simulated using the digitized power supply waveform having noise captured from the printed circuit board at (174). At (178), the computational overhead of the simulation is reduced due to the input of the power supply waveform having noise being used instead of a portion of the power supply network that may contain a large number of elements. Also, the simulation of the PLL at (178) is more accurate because the digitized power supply waveform having noise is used instead of a square wave.

Figure 5B:
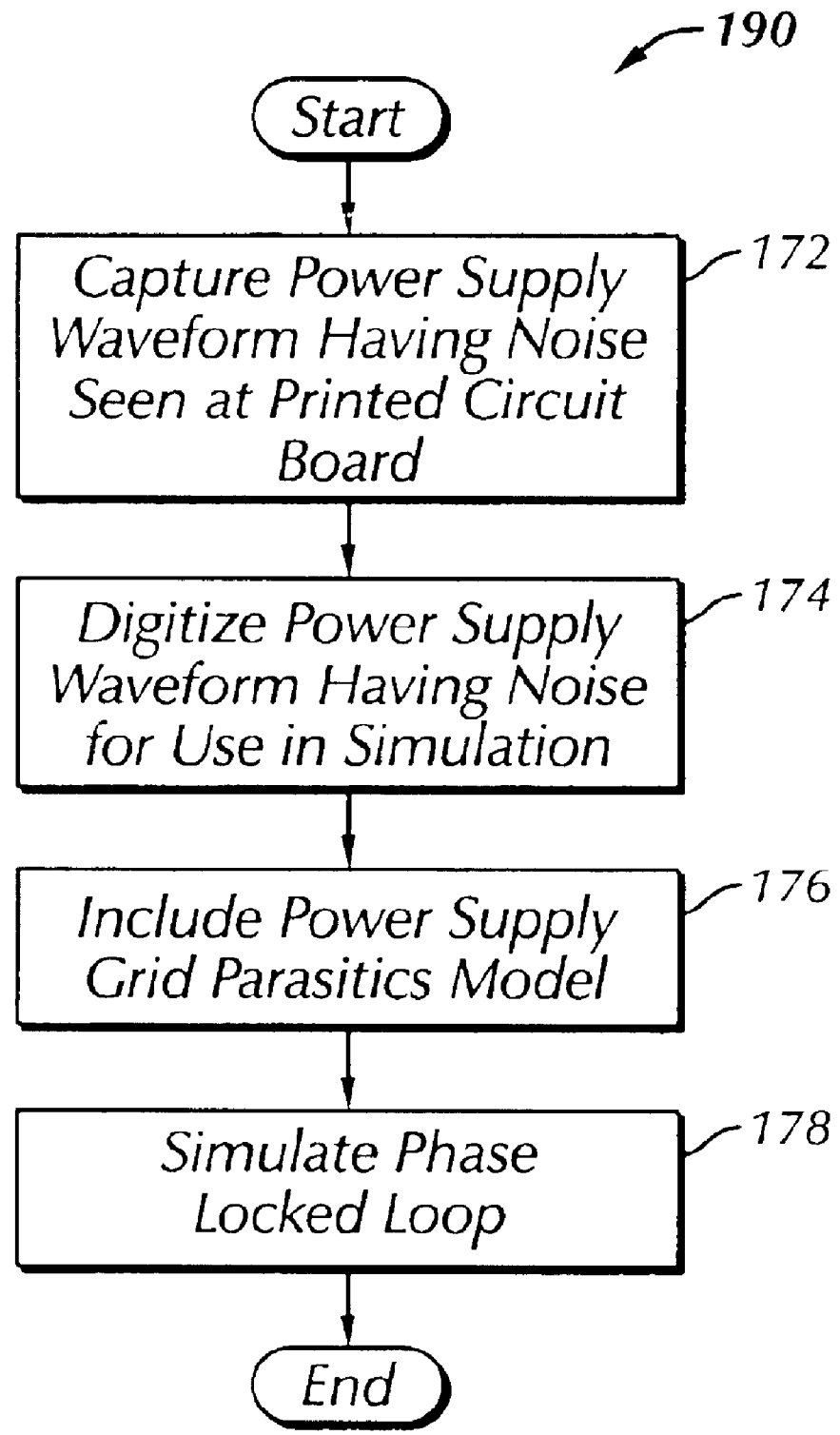
FIG. 5b shows a flow process in accordance with another embodiment of the present invention.

In FIG. 5b, an exemplary flow process (190) in accordance with another embodiment of the present invention is shown. At (172), a power supply waveform having noise, as described previously, is captured. The captured power supply waveform is digitized at (174), as described previously, to be input to a simulation program. Capturing and digitizing the power supply waveform does not preclude the addition of circuits to model another portion of the power supply network not represented in the captured and digitized power supply waveform. This additional portion of the power supply network may be used between the captured power supply waveform and the circuit under design. At (176), elements may be added to the simulation to represent additional power supply network components. For example, a captured power supply signal may be captured on a printed circuit board; however, the circuit to be designed resides on an integrated circuit. At (176), the power supply network elements that may be added include, but are not limited to, connections (parasitics) between the printed circuit board and chip package, connections (parasitics) between the chip package and chip, and connections (parasitics) between the chip power supply network and circuit under design. These added elements may improve the modeling of the actual passive parasitics. At (178), the PLL under design is simulated using the digitized power supply waveform having noise captured from the printed circuit board at (174) and the parasitics from (176). At (178), the computational overhead of the simulation is reduced due to the input of the power supply waveform having noise being used instead of a portion of the power supply network that may contain a large number of elements. Also, the simulation of the PLL at (178) is more accurate because the digitized power supply waveform having noise is used instead of a square wave.

Those skilled in the art will appreciate that the captured power supply waveform having noise may be obtained from probing a physical system, such as a printed circuit board, chip package, or chip, under various operating conditions. Operating conditions include, but are not limited to, temperature, voltage, frequency, and manufacturing (process) variations. Those skilled in the art will also appreciate that the captured power supply waveform having noise may be obtained from probing an integrated circuit under various operating conditions. Furthermore, those skilled in the art will appreciate that the power supply waveform having noise obtained from a physical system may be obtained from a location adjacent to an intended location of the PLL under various operating conditions. Those skilled in the art will further appreciate that using the power supply waveform having noise in place of a portion of the power supply network reduces the computational load when simulating the circuit.

Those skilled in the art will appreciate that the captured power supply signal having noise may be obtained from simulation data of a modeled printed circuit board's parasitics under various operating conditions. Furthermore, those skilled in the art will appreciate that the captured power supply waveform having noise may be obtained from simulation data of a power supply network's parasitics that may include, but is not limited to, the motherboard power supply network, motherboard to integrated circuit connections, and/or integrated circuit power supply network under various operating conditions. Operating conditions include, but are not limited to, temperature, voltage, frequency, and manufacturing (process) variations. Those skilled in the art will further appreciate that the simulation of the circuit using the power supply waveform having noise may be dependent on various operating conditions. Those skilled in the art will also appreciate that the simulation tool used to simulate the power supply waveform having noise does not have to be the same simulation tool used to simulate the circuit using the power supply waveform having noise.

Those skilled in the art will appreciate that capturing the power supply signal having noise, whether from a physical system or simulation, may advantageously be obtained adjacent to an intended location of the PLL.

Those skilled in the art will appreciate that the noise may be captured separately from the power supply waveform and combined to create the power supply waveform having noise.

Those skilled in the art will appreciate that multiple power supply waveforms having noise may be used simultaneously, and the multiple power supply waveforms having noise may be connected to different locations on the power supply network. Those skilled in the art will further appreciate that the PLL and additional circuits may be used in the simulation at (178).

Those skilled in the art will appreciate that the PLL may be analog, digital, or a combination of both types of circuits.

Figure 6:
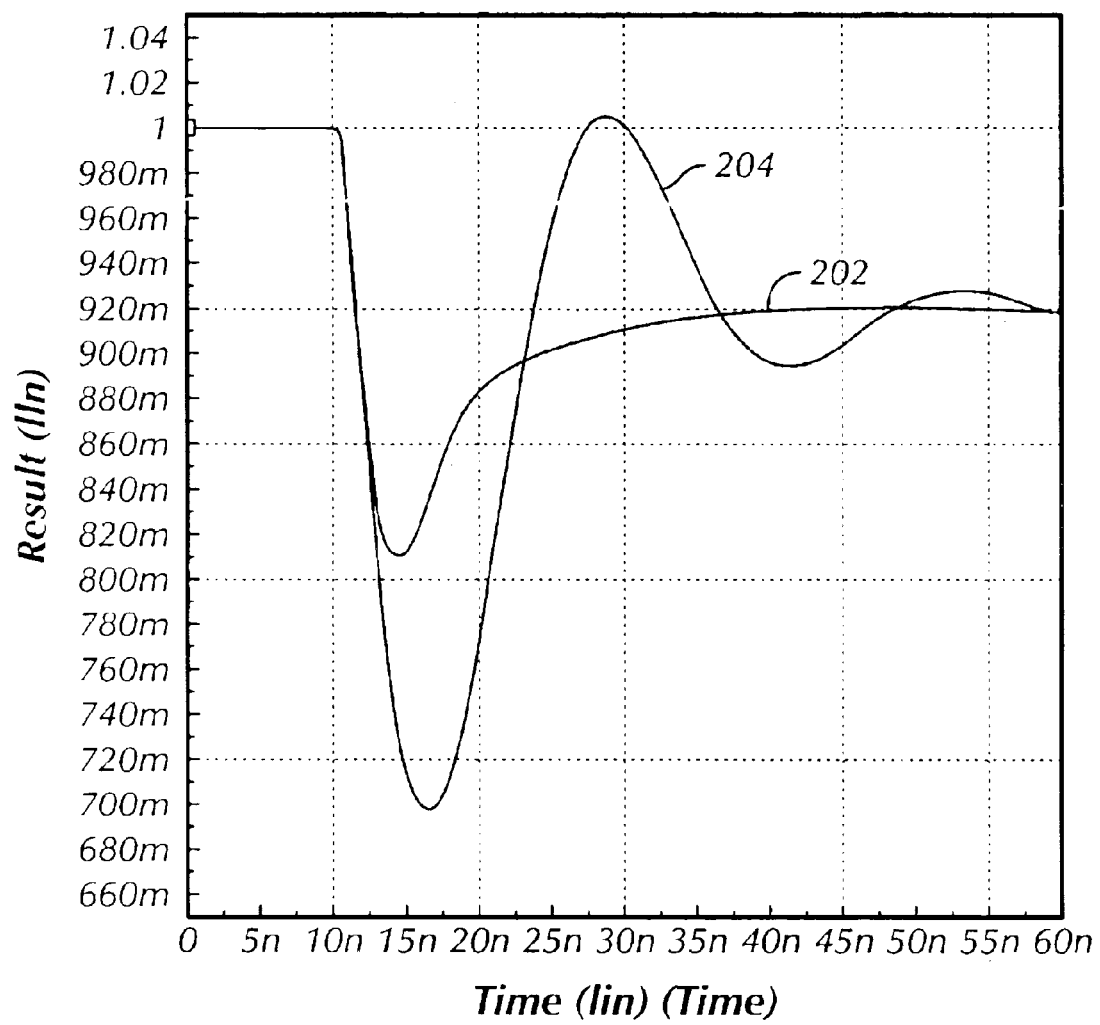
FIG. 6 shows captured power supply waveforms in accordance with another embodiment of the present invention.

In FIG. 6, two captured power supply waveforms having noise (202, 204), in accordance with various embodiments of the present invention, are shown. Both captured power supply waveforms start at time zero at approximately 1 V. At 10 ns, one or more circuits interacting with one or more impedance networks create noise on the power supply waveforms. For power supply waveform (202), the effect is reduced compared to power supply waveform (204). Depending on the needs of a circuit designer, either power supply waveform (202, 204) can be digitized or modeled, and operatively used as the power supply input to the circuit simulation.

Those skilled in the art will appreciate that power supply waveform (202) and power supply waveform (204) may have been captured under different operating conditions. Those skilled in the art will further appreciate that power supply waveform (202) and power supply waveform (204) may have been captured at different locations within the power supply network.

Figure 7:
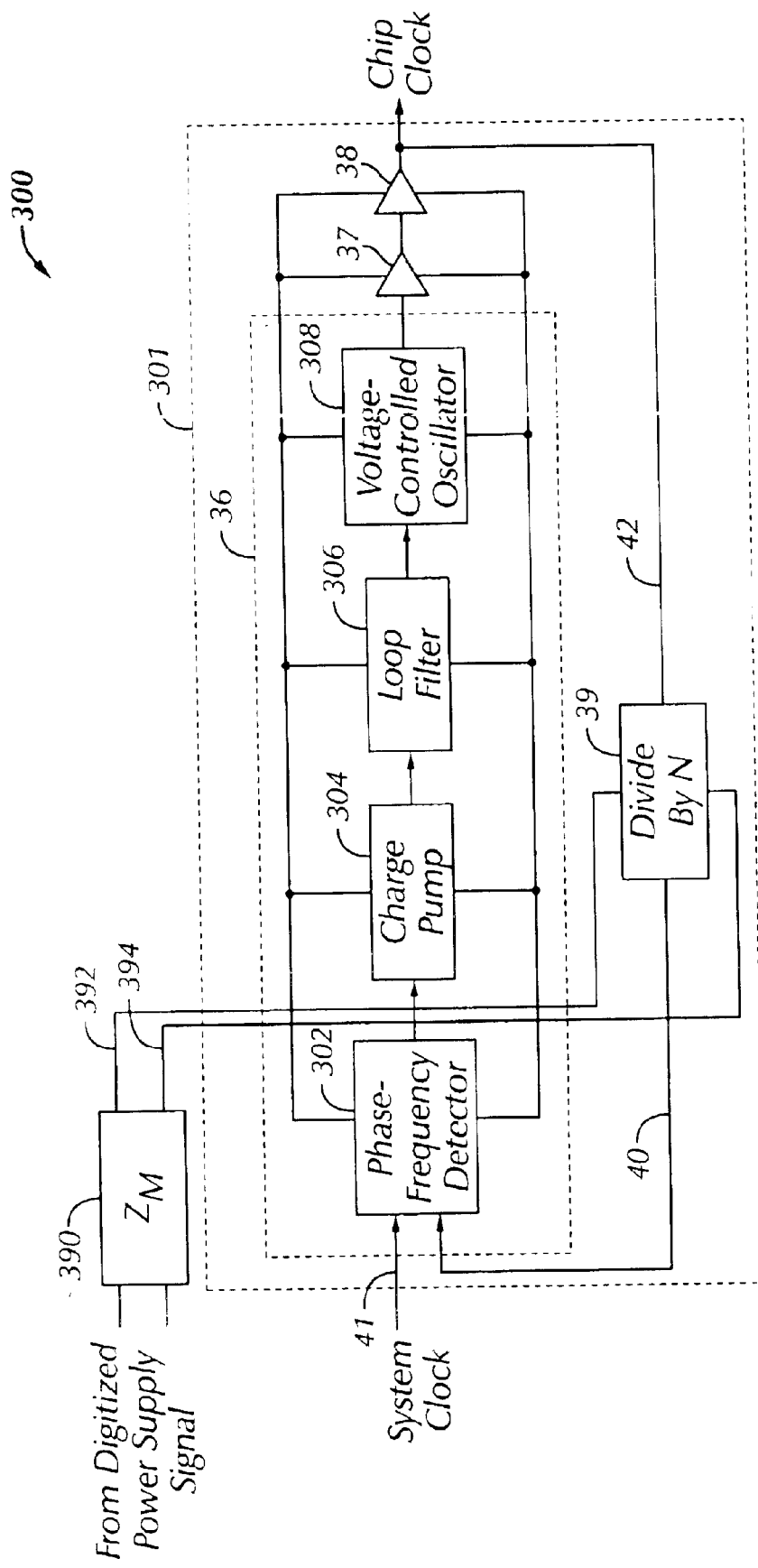
FIG. 7 shows a phase locked loop circuit in accordance with another embodiment of the present invention.

FIG. 7 shows an exemplary circuit (300) in accordance with another embodiment of the present invention. A block diagram drawing of a PLL (301) is shown. The PLL (301) comprises a feedback loop that aligns the transition edge and frequency of the system clock (41) and a feedback loop signal (40). The addition of a divide by N circuit (39) in the feedback loop enables the PLL to multiple the system clock (41). By adding the divide by N block (39), the chip clock (42) must be N times faster than the system clock (41) to allow the phase and frequency difference between the system clock (41) and the feedback loop signal (40) to zero. The PLL (301) may also have buffers (37, 38) to drive a larger resistive and/or capacitive load. The buffers (37, 38) are in the feedback loop so that the delay created by the buffers (37, 38) is zeroed by the PLL core (36).

The PLL core (36) adjusts the phase and frequency difference between the system clock (41) and the feedback loop signal (40). System clock (41) and the feedback loop signal (40) are used as inputs to a phase-frequency detector (302). The phase-frequency detector (302) measures whether the phase and frequency difference between the system clock (41) and the feedback loop signal (40) are correct. An adjustment in the phase or frequency produces signals that control a charge pump (304). The charge pump (304) adds or removes charge from a loop filter (306) that changes the DC value at the input of a voltage-controlled oscillator (308). The voltage-controlled oscillator (308) produces an output that has a frequency related to the input voltage from the loop filter (306). The output from the voltage-controlled oscillator (308), after being buffered by the buffers (37, 38), provides a frequency, N times faster than the system clock (41), to other circuits. Ideally, the chip clock (42) output is a constant multiple by N of the system clock (41) input. The chip clock (42), however, is affected by power supply noise.

Still referring to FIG. 7, a power supply waveform having noise has been determined from a power supply network and digitized. The power supply waveform having noise is operatively used either through direct digitization or appropriate modeling such as a formulated representation where an equation describes the signal's characteristics. The power supply waveform having noise is input to an impedance network $Z_M$ (390). The impedance network $Z_M$ (390) supplies power to the PLL (301) through power supply line (392) and ground line (394). Simulating the PLL (301) with the representation of the power supply waveform having noise provides a technique to estimate jitter.

Jitter represents the perturbations that result in the intermittent shortening or lengthening of signal elements. For example, a steady clock input may be used as a system clock (41) input to the PLL (301). A piece-wise linear representation of the power supply waveform having noise ((202) in FIG. 6)) may be used to supply the impedance network $Z_M$ (390). The power supply waveform having noise (202) may be acquired from a simulation of a printed circuit board from a dominant power supply noise source. The impedance network $Z_M$ (390) represents additional impedances between the printed circuit board and the PLL (301) that is located on an integrated circuit. The power supply waveform having noise may disturb the chip clock (42) output from the buffers (37, 38) driven by the voltage-controlled oscillator (308). Variations between the transition from one state to another state between the system clock (41) input to the PLL (301) and the chip clock (42) output represent jitter. (If N=1, the chip clock (42) and feedback loop signal (40) may be the same frequency.) Because a realistic power supply waveform having noise is used, the PLL will not be over designed with respect to control of jitter. Also, the simulation can be completed in a reasonable amount of time; therefore, the PLL design and/or the chip parasitics may be modified in an iterative fashion to improve the system's performance.

Those skilled in the art will appreciate that a computer system is described for determining a representation of a power supply waveform having noise, using that representation to simulate a phase locked loop, and estimating jitter in the phase locked loop.

Those skilled in the art will appreciate that a computer-readable medium having recorded thereon instructions executable by a processor is described to determine a representation of a power supply waveform having noise, using that representation to simulate a phase locked loop, and estimating jitter in the phase locked loop.

Advantages of the present invention may include one or more of the following. In some embodiments, because a representation of a power supply signal having noise is used, a more accurate circuit simulation may be performed. Realistic results help alleviate costly over design. A circuit designed with more accurate power supply waveforms may result in reduced chip area. The space saved due to the reduced chip area may be used for additional performance enhancing circuits, or may be used to reduce the final chip size, hence cost.

In some embodiments, because a representation of a power supply signal having noise is used, a circuit simulation that requires less computational load may be performed. Accordingly, more iterations in the design process may be afforded.

In some embodiments, because a representation of a power supply signal having noise is used, tasks involved with designing a power supply network and individual circuits may be advantageously divided and performed by experts in their respective areas of expertise.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for estimating jitter in a phase locked loop, comprising:
    obtaining a representative power supply waveform having noise;
    digitizing the representative power supply waveform having noise;
    simulating operation of the phase locked loop prior to fabrication of the phase locked loop using the digitized representatively power supply waveform having noise as a power supply input to the phase locked loop; and
    estimating jitter of the phase locked loop based on the simulating.

2. The method of claim 1, wherein the representative power supply waveform is obtained from a physical system.

3. The method of claim 2, wherein the physical system comprises a printed circuit board.

4. The method of claim 2, wherein the physical system comprises a chip package.

5. The method of claim 2, wherein the physical system comprises a chip.

6. The method of claim 1, wherein the representative power supply waveform is obtained from a location on a physical system adjacent to an intended location of the phase locked loop.

7. The method of claim 1, wherein the representative power supply waveform is obtained from a simulation of a power supply.

8. A method for estimating jitter in a phase locked loop, comprising:
    inputting a representative power supply waveform having noise into a simulation of the phase locked loop; and
    estimating jitter of the phase locked loop from the simulation, wherein the representative power supply waveform is obtained from a simulation of a power supply, wherein the simulation of the power supply is performed using a first simulation tool and the simulation of the phase locked loop is performed using a second simulation tool.

9. The method of claim 1, wherein the representative power supply waveform comprises a noise waveform combined with a power supply waveform.

10. The method of claim 1, wherein the representative power supply waveform is dependent on at least one selected from the group consisting of temperature, voltage, frequency, and manufacturing process.

11. The method of claim 1, wherein the simulation of the phase locked loop is dependent on at least one selected from the group consisting of temperature, voltage, frequency, and manufacturing process.

12. A computer system for estimating jitter in a phase locked loop, comprising:
   a processor;
   a memory; and
   software instructions stored in the memory adapted to cause the computer system to:
      obtain a representative power supply waveform having noise;
      digitize the representative power supply waveform having noise;
      simulate operation of the phase locked loop prior to fabrication of the phase locked loon using the digitized representatively power supply waveform having noise as a power supply input to the phase locked loop; and
      estimate jitter of the phase locked loop from the simulation.

13. The computer system of claim 12, wherein the representative power supply waveform is obtained from a physical system.

14. The computer system of claim 13, wherein the physical system comprises a printed circuit board.

15. The computer system of claim 13, wherein the physical system comprises a chip package.

16. The computer system of claim 13, wherein the physical system comprises a chip.

17. The computer system of claim 12, wherein the representative power supply waveform is obtained from a location on a physical system adjacent to an intended location of the phase locked loop.

18. The computer system of claim 12, wherein the representative power supply waveform is obtained from a simulation of a power supply.

19. A computer system for estimating jitter in a phase locked loop, comprising:
   a processor;
   a memory; and
   software instructions stored in the memory adapted to cause the computer system to:
      input a representative power supply waveform having noise into a simulation of the phase locked loop; and
      estimate jitter of the phase locked loop from the simulation;
      wherein the representative power supply waveform is obtained from a simulation of a power supply, and
      wherein the simulation of the power supply is performed using a first simulation tool and the simulation of the phase locked loop is performed using a second simulation tool.

20. The computer system of claim 12, wherein the representative power supply waveform comprises a noise waveform combined with a power supply waveform.

21. The computer system of claim 12, wherein the representative power supply waveform is dependent on at least one selected from the group consisting of temperature, voltage, frequency, and manufacturing process.

22. The computer system of claim 12, wherein the simulation of the phase locked loop is dependent on at least one selected from the group consisting of temperature, voltage, frequency, and manufacturing process.

23. A computer-readable medium having recorded thereon instructions executable by a processor, the instructions adapted to:
   obtain a representative power supply waveform having noise;
   digitize the representative power supply waveform having noise;
   simulate operation of a phase locked loop prior to fabrication of the phase locked loon using the digitized representatively power supply waveform having noise as a power supply input to the phase locked loop; and
   estimate jitter of the phase locked loop from the simulation.

24. The computer-readable medium of claim 23, wherein the representative power supply waveform is obtained from a physical system.

25. The computer-readable medium of claim 24, wherein the physical system comprises a printed circuit board.

26. The computer-readable medium of claim 24, wherein the physical system comprises a chip package.

27. The computer-readable medium of claim 24, wherein the physical system comprises a chip.

28. The computer-readable medium of claim 23, wherein the representative power supply waveform is obtained from a location on a physical system adjacent to an intended location of the phase locked loop.

29. The computer-readable medium of claim 23, wherein the representative power supply waveform is obtained from a simulation of a power supply.

30. A computer-readable medium having recorded thereon instructions executable by a processor, the instructions adapted to:
   input a representative power supply waveform having noise into a simulation of a phase locked loop; and
   estimate jitter of the phase locked loop from the simulation,
   wherein the representative power supply waveform is obtained from a simulation of a power supply, and
   wherein the simulation of the power supply is performed using a first simulation tool and the simulation of the phase locked loop is performed using a second simulation tool.

31. The computer-readable medium of claim 23, wherein the representative power supply waveform comprises a noise waveform combined with a power supply waveform.

32. The computer-readable medium of claim 23, wherein the representative power supply waveform is dependent on at least one selected from the group consisting of temperature, voltage, frequency, and manufacturing process.

33. The computer-readable medium of claim 23, wherein the simulation of the phase locked loop is dependent on at least one selected from the group consisting of temperature, voltage, frequency, and manufacturing process.

* * * * *

UNITED STATES PATENT AND TRADEMARK OFFICE
CERTIFICATE OF CORRECTION

PATENT NO. : 6,819,192 B2
DATED : November 16, 2004
INVENTOR(S) : Claude R. Gauthier et al.

It is certified that error appears in the above-identified patent and that said Letters Patent is hereby corrected as shown below:

Column 9,
Line 29, please replace "loon" with -- loop --.

Column 10,
Line 20, please replace "loon" with -- loop --.

Signed and Sealed this

Twenty-ninth Day of March, 2005

JON W. DUDAS
*Director of the United States Patent and Trademark Office*